United States Patent
Llapitan et al.

(10) Patent No.: US 8,081,489 B2
(45) Date of Patent: Dec. 20, 2011

(54) TWO PIECE WIRE BALE INDEPENDENT LOAD MECHANISM

(75) Inventors: David J. Llapitan, Tacoma, WA (US); Christopher S. Beall, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 396 days.

(21) Appl. No.: 12/344,193

(22) Filed: Dec. 24, 2008

(65) Prior Publication Data

US 2010/0157563 A1 Jun. 24, 2010

(51) Int. Cl.
*H05K 7/18* (2006.01)

(52) U.S. Cl. .......... 361/801; 361/803; 361/755

(58) Field of Classification Search .......... 361/600, 361/679.01, 748, 784–785, 791–794, 801–803, 361/755; 439/55, 65–68, 296, 330–331
See application file for complete search history.

(56) References Cited

U.S. PATENT DOCUMENTS

| | | | | |
|---|---|---|---|---|
| 4,560,217 | A * | 12/1985 | Siano | 439/68 |
| 6,101,091 | A | 8/2000 | Baik | 361/704 |
| 6,159,031 | A | 12/2000 | Llapitan et al. | 439/326 |
| 6,327,147 | B1 | 12/2001 | Llapitan et al. | 361/704 |
| 6,585,534 | B2 | 7/2003 | Llapitan et al. | 439/327 |
| 6,657,868 | B1 | 12/2003 | Hsue | 361/728 |
| 6,722,908 | B2 | 4/2004 | Llapitan et al. | 439/327 |
| 6,762,932 | B2 | 7/2004 | Regimbal et al. | 361/679.33 |
| 6,847,521 | B2 | 1/2005 | Beall et al. | 361/679.02 |
| 6,860,693 | B2 | 3/2005 | Jones et al. | 411/433 |
| 7,126,828 | B2 | 10/2006 | Beall et al. | 361/801 |
| 7,147,483 | B1 | 12/2006 | Ju | |
| 7,203,067 | B2 | 4/2007 | Beall et al. | 361/726 |
| 7,252,517 | B2 * | 8/2007 | Ju | 439/73 |
| 7,371,100 | B1 | 5/2008 | Polnyi | |
| 7,453,707 | B2 | 11/2008 | Beall et al. | 361/796 |
| 7,455,526 | B1 | 11/2008 | Ila et al. | 439/41 |
| 7,604,486 | B2 | 10/2009 | Martinson et al. | 439/70 |
| 7,623,344 | B2 | 11/2009 | Beall et al. | 361/679.48 |
| 2010/0159730 | A1 | 6/2010 | Llapitan et al. | 439/329 |

* cited by examiner

*Primary Examiner* — Hung S Bui
(74) *Attorney, Agent, or Firm* — Konrad Raynes & Victor LLP; Alan S. Raynes

(57) ABSTRACT

Electronic assemblies are described. One embodiment includes a circuit board, a socket coupled to the circuit board, and a device positioned in the socket. The embodiment also includes a load mechanism including first and second components, the first component pivotally coupled to the circuit board, the first component including first and second lever arms and an axle region therebetween, the first component also including a load arm region extending from the axle region and adapted to transmit a load when a force is applied to the first component lever arms. The load mechanism also includes a second component pivotally coupled to the circuit board, the second component including first and second lever arms and an axle region therebetween, the second wire component also including a load arm region extending from the axle region and adapted to transmit a load when a force is applied to the second wire component lever arms. The first and second wire components are positioned so that when a force is applied to the first component lever arms, the first lever arm of the first component engages the first lever arm of the second component and applies a force thereto, and the second lever arm of the first component engages the second lever arm of the second component and applies a force thereto. Other embodiments are described and claimed.

20 Claims, 4 Drawing Sheets

TWO PIECE WIRE BALE INDEPENDENT LOAD MECHANISM

RELATED ART

An integrated circuit (IC) package is used to electrically couple an IC die to external components and circuitry. The IC package typically includes a die (for example, a silicon chip) coupled to a package substrate, with electrical contacts from the die coupled to electrical contacts on one side of the package substrate, which are in turn electrically coupled to external contacts on the other side of the package substrate. The external contacts of the package may include any suitable structure, including, but not limited to, pins and solder bumps arranged in any suitable pattern.

The external contacts of an IC package may be mounted directly to the electrical contacts of a structure such as a printed circuit board (for example, a motherboard). Alternatively, sockets have been devised to attach an IC package to electrical contacts of a board. The sockets may be designed to permit the IC package to be easily removed from the board. For example, electrical contacts of an IC package may be removably coupled to first contacts of a socket, and second contacts of the socket may be coupled to a board.

In order to ensure a suitable electrical contact between an IC package and the socket contacts, some architectures require the application of a force to press the contacts of the socket against corresponding contacts of the package. If the force is not within a specified range pertinent to the socket, this may cause undesirable stresses in the system, leading to damage in the IC package, the socket, the package/socket interface, and/or the socket/board interface.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to electronic assemblies and mechanisms for applying a force to an electronic component.

An independent load mechanism (ILM) may be used to apply a load force to a package so that the package can make contact with the contacts on a socket coupled to a circuit board. Existing ILM structures have applied the load force to an integrated heat spreader (IHS) positioned on the die in a package. The load is typically a 2 point load that travels though the heat spreader to the die. If the load is too large, it can damage the die and/or solder bumps under the heat spreader. Certain embodiments utilize a two piece wire bale ILM structure, in which two wire components are configured to apply a distributed load to the electronic component.

FIG. 1-4 illustrate view of various components in an electronic assembly including an independent load mechanism, in accordance with certain embodiments. The electronic assembly includes a circuit board 10 having a socket 12 coupled thereto. A package 14 is positioned in the socket 12. The assembly may include a stiffener 15 on the package 14.

Figure 1:
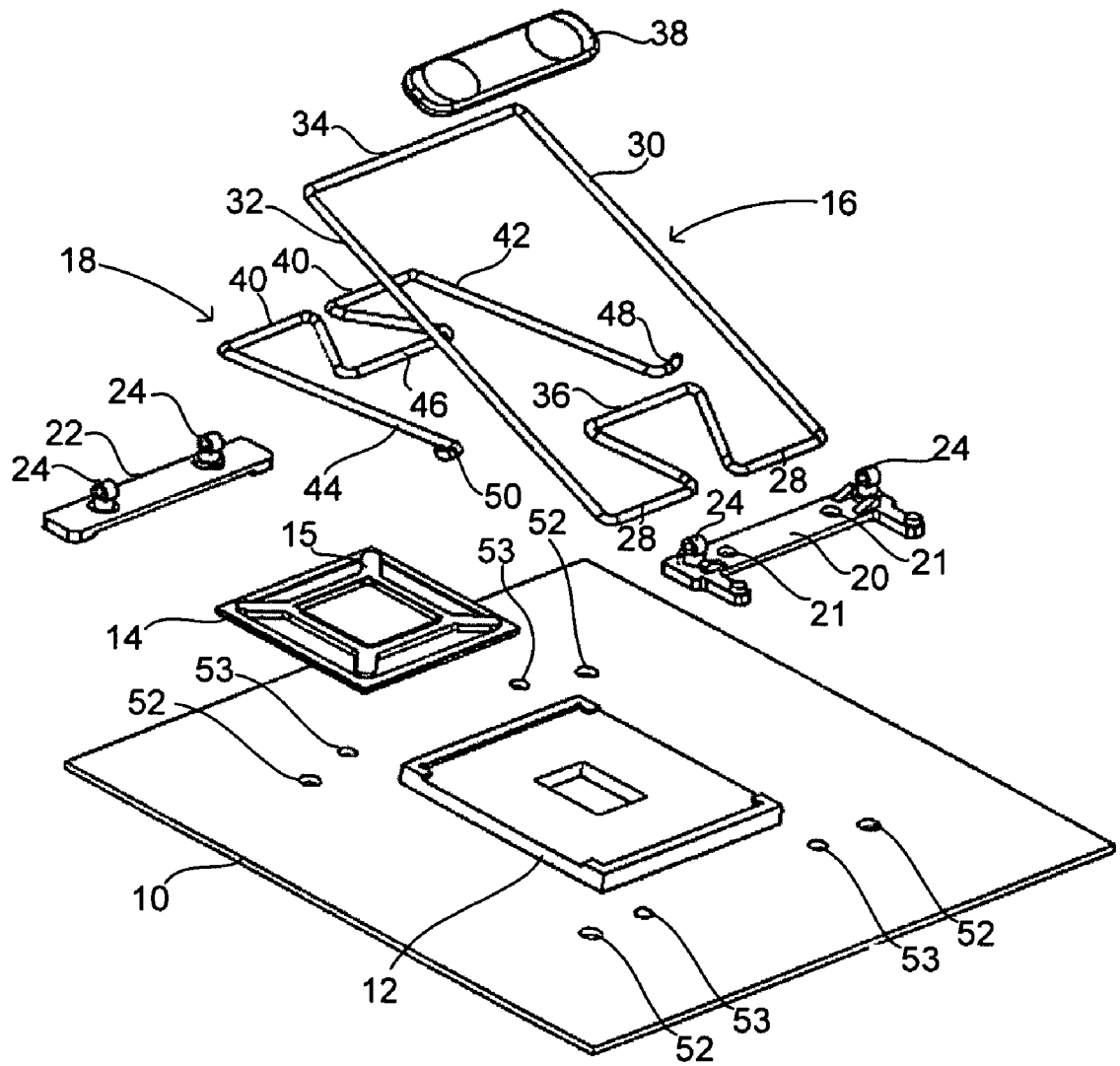
FIG. 1 is an exploded view of certain components in a system in accordance with certain embodiments.

As illustrated in the exploded view of FIG. 1, the load mechanism structure includes a two piece configuration, including component 16 and component 18. The components 16 and 18 may be formed from any suitable material, for example, a wire having suitable mechanical properties that can be bent into the appropriate shape. The component 16 is pivotally coupled to the circuit board 10 through hinge or hook members 24 positioned on a mounting region 20 that is coupled to the board 14. Alternatively, the mounting region may be omitted and the hook members 24 may be directly connected to the board 14. Any suitable coupling mechanism for forming a pivoting connection may be used. The component 16 includes first and second lever arms 30, 32 that are substantially parallel to each other and that are separated by a handle region 34 at a first end of the lever arms 30, 32, and an axle region 28 at a second end of the lever arms 30, 32. A load arm region 36 extends from the axle region 28 and is adapted to transmit a load to the package 14 in the socket 12. The lever arms 30, 32, the handle region 34, the axle region 28, and the load arm region 36 may be formed integrally from a single piece of wire that is bent to incorporate each element accordingly. The handle piece 38 is sized and shaped to be easily pressed by a finger, in order to apply a force to the component 16 in order to load the package 14. While the components 16, 18 may be discussed as if formed from a wire, the material of the components 16, 18 need not be a wire in all embodiments.

Figure 2:
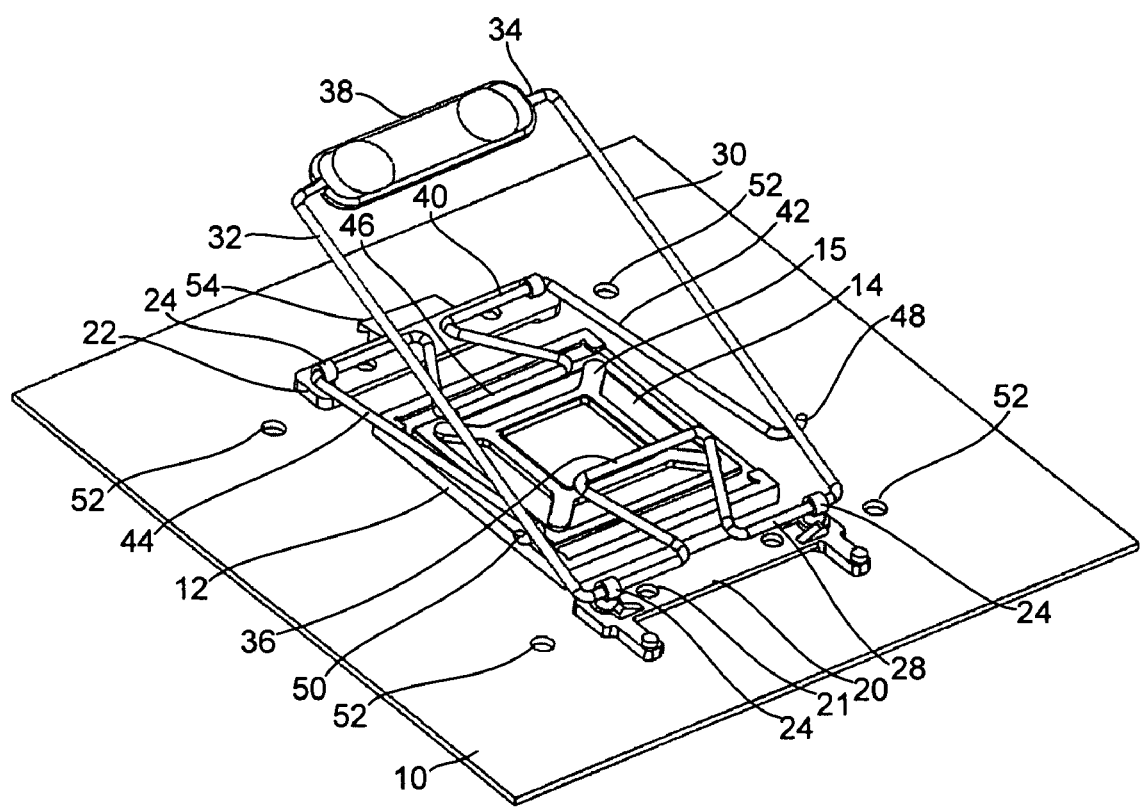
FIG. 2 is a perspective view of certain components in a system in accordance with certain embodiments.
Figure 3:
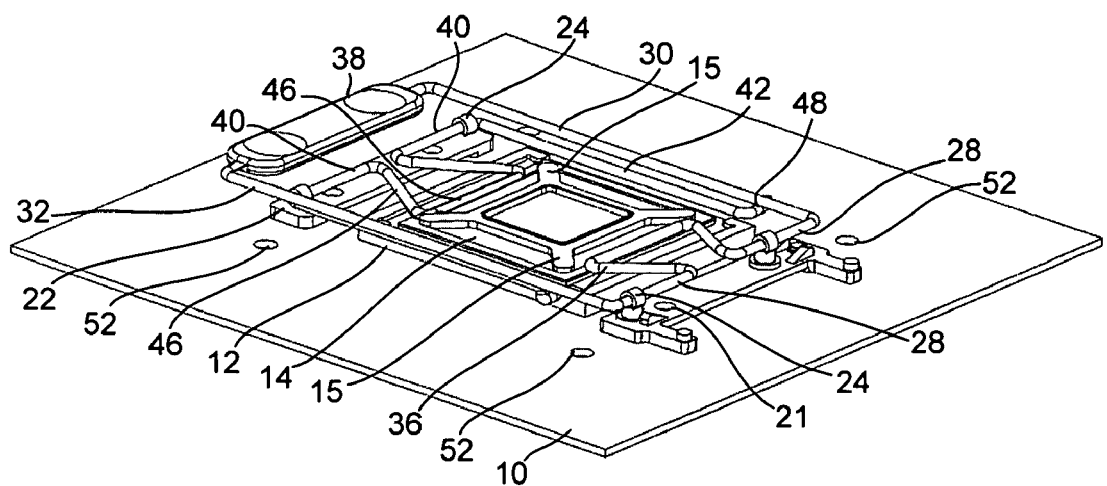
FIG. 3 is a perspective view of certain components in a system, in accordance with certain embodiments.

The component 16 is configured so that the axle region 28, the lever arms 30, 32, and the handle region 34 are positioned to the sides of the package 14. The load arm region 36 extends inward so that it can engage the package 14 when a force is applied to the handle region 34. As seen in FIGS. 1-3, the wire forming the axle region 28 extends a distance along the pivoting axis from a longitudinal end of each of the lever arms 30, 32 and turns inward to form load arm region 36, which has a generally triangular shape with one side of the triangle adapted to contact the package 14 along the length of the triangle side. The other two sides of the triangle shape of load arm region 36 extend to the axle region 28.

The component 18 is pivotally coupled to the circuit board 10 through hinge or hook members 24 positioned on a mounting region 22 that is coupled to the board 10. The component 18 includes first and second lever arms 42, 44 that are substantially parallel to each other and that are separated by an axle region 40 at one end of the lever arms 30, 32. A load arm region 46 extends from the axle region 40 and is adapted to transmit a load to the package 14 in the socket 12. The lever arms 30, 32, the axle region 28, and the load arm region 36 may be formed integrally from a single piece of wire that is bent to incorporate each element accordingly.

The component 18 is configured so that the axle region 40 and the lever arms 42, 44 are positioned to the sides of the package 14. The load arm region 46 extends inward so that it can engage the package 14. As seen in FIGS. 1-3, the wire forming the axle region 40 extends a distance along the pivoting axis from a longitudinal end of each of the lever arms 42, 44 and turns inward to form load arm region 46, which has a generally triangular shape with one side of the triangle adapted to contact the package 14 along the length of the triangle side. The other two sides of the triangle shape of the load arm region 46 extend to the axle region 40.

FIG. 2 illustrates a perspective view of the electronic assembly with the load mechanism in a semi-opened position, in accordance with certain embodiments. The components 16, 18 are positioned so that the lever arms 30, 32 of component 18 can engage end regions 48, 50 of the lever arms 42, 44 of component 16. This permits a single application of force to apply a load to both the load arm region 36 of component 16 and the load arm region 46 of the component 18. This is because force applied on the handle piece 38 on the handle region 34 will be transmitted through the lever arms 30, 32 to the lever arms 42, 44. As a result, a relatively large load can be applied to the package 14 with a single action.

FIG. 2 also illustrates latch 54, which is positioned to engage the tab 38 when the tab 38 is pressed down and the two piece wire bale is fully engaged. Any suitable mechanism for holding the load mechanism in a closed position may be used.

FIG. 3 illustrates a perspective view of the electronic assembly including the load mechanism in a closed position, with the load arm regions 36, 46 engaging the package 14. As seen in FIG. 2, the package 14 is engaged along a central length of each of the load arm regions 36, 46. This configuration, by spreading the load along the central length of the load arm regions 36, 46, yields a more constant and better load spreading when compared with conventional load application designs.

Figure 4:
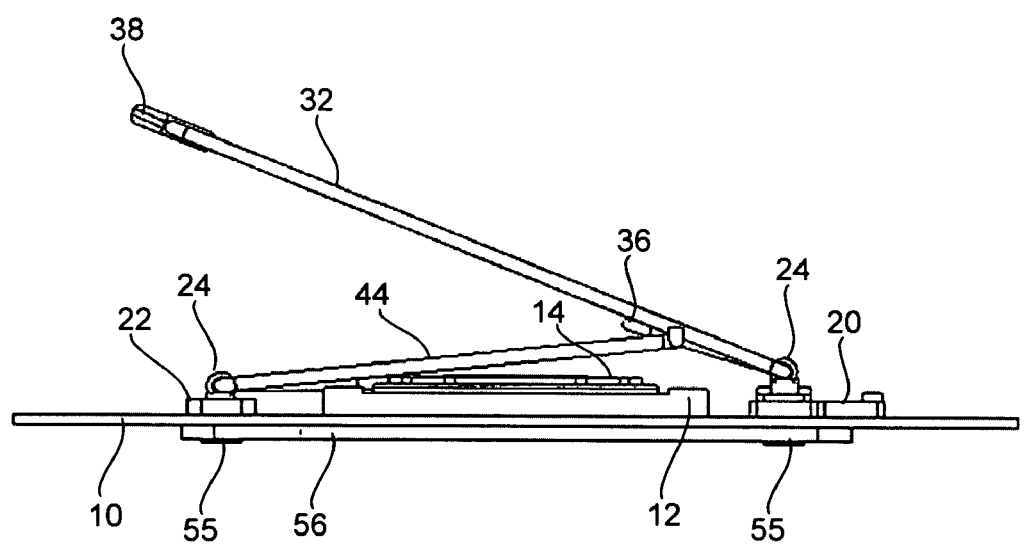
FIG. 4 is a side view of certain components in a system, in accordance with certain embodiments.

The interaction of the lever arm 32 of component 16 and lever arm 44 of component 18 can be seen in FIG. 4, which shows a side view of the load mechanism in a semi-opened position The load arm region 36 can be seen to be angled downward relative to the lever arm 32. As force is applied to the handle piece 38, the lever arm 32 applies a force to the load arm region 36. The lever arm 32 also applies a force to the lever arm 44 at end region 50. Lever arm 44 in turn applies a force to the load arm region 46 (not shown in FIG. 4). Thus, as the handle piece 38 is brought towards the circuit board 10, the load arm regions 36, 46 will both apply a force to the package 14 in the socket 12. It should be appreciated that the downward angle of the load arm regions 36, 46 may be varied in different embodiments.

The components 16, 18 may be configured so that the resultant load force each applies to the package is the same per side. In order to accomplish an equal load force being applied to the package on each side, at least some of the various arms and regions of the components 16, 18 may be formed to have differing stiffnesses.

FIG. 4 also illustrates the coupling of the mounting regions 20, 22 to the circuit board. This may accomplished using any suitable method. One method uses screws 55, as seen in FIG. 4, that may extend through apertures 53 in the circuit board and apertures 21 in the mounting regions 20, 22. The screws 55 also extend through mounting plate 60 positioned on the lower surface of the board 10. In certain embodiments the mounting regions 20, 22 may be omitted and the coupling mechanisms for coupling the components 16, 18 may be directly connected to the board 14. FIGS. 1-3 also illustrate apertures 52 extending through the circuit board. These apertures 52 may be used for mounting additional components to the assembly. Such additional components may be mounted either before or after the load mechanism is actuated. One example of such a component is a heat sink.

Certain embodiments may provide one or more of the following advantages over conventional load mechanisms for applying a force to position a package in a socket. As noted above, a first advantage is the ability to provide a large force from a single loading action due to the multiple lever arms and regions. A second advantage is that embodiments have an extremely low profile. Certain conventional load mechanisms have included a thick frame which requires the use of a pedestal from the heatsink. Such thick frames and pedestals are not required, as seen, for example, in FIGS. 1-4. A third advantage is that the package itself is loaded, whereas certain conventional mechanisms apply a load to a heat spreader positioned on the die. Such loading can lead to excessive stresses on the die and/or solder bumps. By loading the package instead of the heat spreader, stresses to the die and solder bumps are minimized. A fourth advantage is the ability to open and close the system with a single application of force using, for example, a finger, instead of needing to perform multiple operations and using a tool to engage the components. A fifth advantage relates to the distributed loading. Instead of two point loading, embodiments may utilize distributed loading across a portion of the package, which causes less warpage to the package when loaded, which in turn encourages better contact between the package and socket.

Numerous modifications may be made to the features shown in the Figures. For example, the wire forming the handle region 34 in FIG. 1 is shown to extend the entire distance between the lever arms 30, 32. Alternatively, the wire may be formed so that it does not extend the entire the entire distance between the lever arms 30, 32, but is attached to a handle piece positioned between the lever arms 30, 32. Moreover, the shape of the various arms and regions may be modified to accommodate different package and socket designs. Embodiments may also permit the use of a bare die package, where the loading is delivered directly to the die. The ability to spread the load and apply the load in equal amounts as described above leads to lower stresses being transmitted to the die.

In addition, the angles between the various portions of the components 16, 18 may be varied. For example, the component 16 as illustrated in FIG. 1 includes a 90 degree angle between the lever arm 30 and the handle region 34. There is also a 90 degree angle between the handle region and the lever arm 32. The component also includes a 90 degree angle between the lever arms 32 and the axle region 28 to which is connects, and a 90 degree angle between the lever am 30 and the axle region 28 to which it connects. Portions of the component 16 also have an angle other than a right angle, including the angle between the axle regions 28 and the load arm region 36, which are bent more than 90 degrees to form the triangular shape as seen in FIG. 1, for example. The component 18 similarly includes some angles that are right angles and some that are different. It should be appreciated that these angles may vary depending on issues including, but not limited to, the geometry of the package and socket, the presence of other structures in the assembly, and the control of the amount of force the component applies. In addition, as seen in the side view of FIG. 4, the load arm region 36 is angled downward from the rest of the component 18. Changing this angle can change the amount of force that will be applied to the package. Thus, it should be appreciated that the downward angle of the load arm regions 36 and 46 may be varied in different embodiments.

Figure 5:
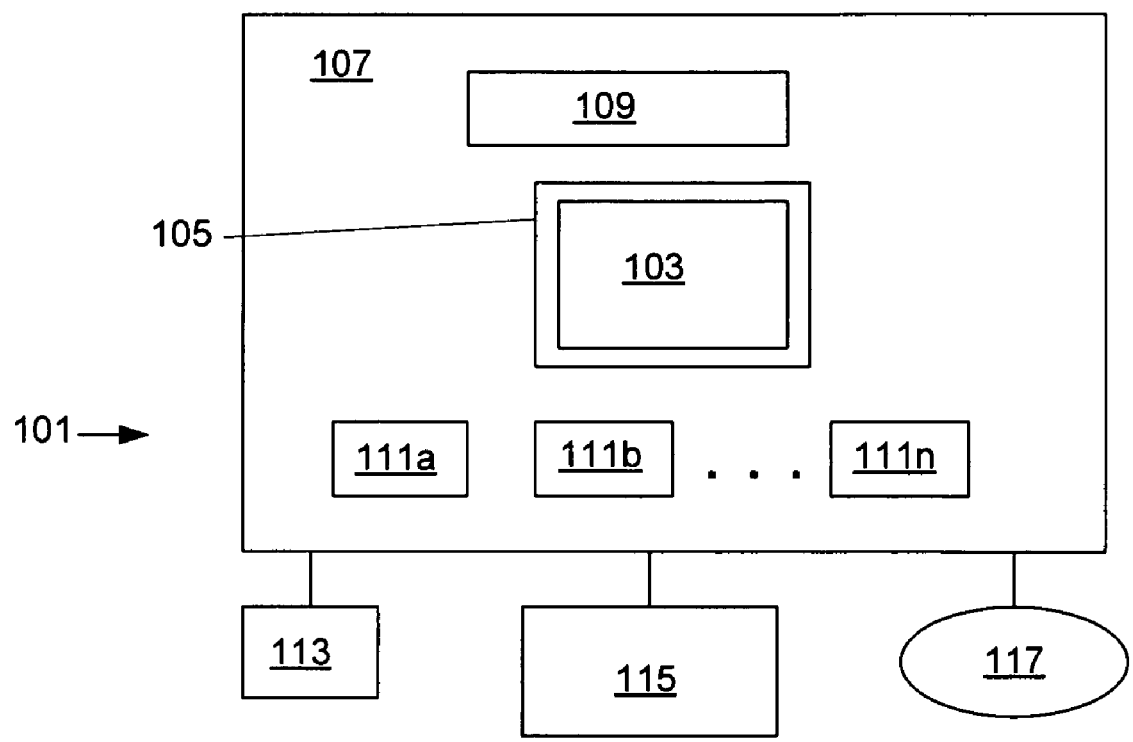
FIG. 5 illustrates an electronic system arrangement in which embodiments may find application.

Assemblies such as those described above may find application in a variety of electronic components. FIG. 5 schematically illustrates one example of an electronic system environment in which aspects of described embodiments may be embodied. Other embodiments need not include all of the features specified in FIG. 5, and may include alternative features not specified in FIG. 5.

The system 101 of FIG. 5 may include at least one central processing unit (CPU) 103. The CPU 103, also referred to as a microprocessor, may be a semiconductor die which is attached to a package substrate 105, which is then coupled to a printed circuit board 107, which in this embodiment, may be a motherboard. The package substrate 105 is an example of an electronic device which may be coupled to a socket on the printed circuit board 107 in accordance with embodiments as described herein. A variety of other system components, including, but not limited to memory and other components discussed below, may also be coupled to structures in accordance with the embodiments described above.

The system 101 may further include memory 109 and one or more controllers 111a, 111b . . . 111n, which are also disposed on the motherboard 107. The motherboard 107 may be a single layer or multi layered board which has a plurality of conductive lines that provide communication between the circuits in the package 105 and other components mounted to the board 107. Alternatively, one or more of the CPU 103, memory 109 and controllers 111a, 111b . . . 111n may be disposed on other cards such as daughter cards or expansion cards. The CPU 103, memory 109 and controllers 111a, 111b . . . 111n may each be seated in individual sockets or may be connected directly to a printed circuit board. A display 115 may also be included.

Any suitable operating system and various applications execute on the CPU 103 and reside in the memory 109. The content residing in memory 109 may be cached in accordance with known caching techniques. Programs and data in memory 109 may be swapped into storage 113 as part of memory management operations. The system 101 may comprise any suitable computing device, including, but not limited to, a mainframe, server, personal computer, workstation, laptop, handheld computer, handheld gaming device, handheld entertainment device (for example, MP3 (moving picture experts group layer—3 audio) player), PDA (personal digital assistant) telephony device (wireless or wired), network appliance, virtualization device, storage controller, network controller, router, etc.

The controllers 111a, 111b . . . 111n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 113 in accordance with a storage protocol layer. The storage protocol of the layer may be any of a number of known storage protocols. Data being written to or read from the storage 113 may be cached in accordance with known caching techniques. A network controller can include one or more protocol layers to send and receive network packets to and from remote devices over a network 117. The network 117 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications to the structures and methods described herein may occur to those having ordinary skill in the art.

What is claimed:

1. A load mechanism comprising:
   a first component including first and second lever arms and an axle region therebetween, the first component also including a load arm region extending from the axle region and adapted to transmit a load when a force is applied to the first component lever arms, the first component further including a handle region positioned between the first component lever arms;
   a second component including first and second lever arms and an axle region therebetween, the second component also including a load arm region extending from the axle region and adapted to transmit a load when a force is applied to the second component lever arms;
   wherein the first and second components are positioned so that when a force is applied to the first component lever arms, the first lever arm of the first component engages the first lever arm of the second component and applies a force thereto, and the second lever arm of the first component engages the second lever arm of the second component and applies a force thereto; and
   a latch positioned to engage the handle region when a suitable force is applied to the handle region.

2. The load mechanism of claim 1 wherein the first and second lever arms of the first and second components and the load arm regions of the first and second components are formed from a wire.

3. The load mechanism of claim 1 wherein the load arm regions of the first and second components are substantially triangular shaped.

4. The load mechanism of claim 1, wherein the first and second lever arms of the first component are longer than the first and second lever arms of the second component.

5. A load mechanism comprising:
   a first component including first and second lever arms and an axle region therebetween, the first component also including a load arm region extending from the axle region and adapted to transmit a load when a force is applied to the first component lever arms, the first component further including a handle region; wherein the first component first and second lever arms, the axle region therebetween, the load arm region extending from the axle region, and the handle region are integrally formed; and
   a second component including first and second lever arms and an axle region therebetween, the second component also including a load arm region extending from the axle region and adapted to transmit a load when a force is applied to the second component lever arms;
   wherein the first and second components are positioned so that when a force is applied to the first component lever arms, the first lever arm of the first component engages the first lever arm of the second component and applies a force thereto, and the second lever arm of the first component engages the second lever arm of the second component and applies a force thereto.

6. The load mechanism of claim 5, wherein the second component first and second lever arms, the axle region therebetween, and the load arm region extending from the axle region are integrally formed.

7. The load mechanism of claim 5, wherein the first and second lever arms of the first and second components and the load arm regions of the first and second components are formed from a wire.

8. The load mechanism of claim 5, wherein the load arm regions of the first and second components are substantially triangular shaped.

9. The load mechanism of claim 5, wherein the first and second lever arms of the first component are longer than the first and second lever arms of the second component.

10. An electronic assembly comprising:
    a circuit board;
    a socket coupled to the circuit board;

a device positioned in the socket; and a load mechanism including first and second components;

the first component pivotally coupled to the circuit board, the first component including first and second lever arms and an axle region therebetween, the first component also including a load arm region extending from the axle region and adapted to transmit a load when a force is applied to the first component lever arms; the first component further including a handle region, wherein the first component first and second lever arms, the axle region therebetween, the load arm region extending from the axle region, and the handle region are integrally formed; and the second component pivotally coupled to the circuit board, the second component including first and second lever arms and an axle region therebetween, the second component also including a load arm region extending from the axle region and adapted to transmit a load when a force is applied to the second component lever arms;

wherein the first and second components are positioned so that when a force is applied to the first component lever arms, the first lever arm of the first component engages the first lever arm of the second component and applies a force thereto, and the second lever arm of the first component engages the second lever arm of the second component and applies a force thereto;

wherein the load mechanism is positioned so that a sufficient application of force applied to the load mechanism will cause the load arm region of the first component and the load arm region of the second component to contact the device.

11. The electronic assembly of claim 10, wherein the first and second lever arms of the first and second components and the load arm regions of the first and second components are formed from a wire.

12. The electronic assembly of claim 10, wherein the load arm regions of the first and second components are substantially triangular shaped.

13. The electronic assembly of claim 10, wherein the device comprises a package, the package including at least one die and a substrate to which the die is coupled, and wherein the load arm region of the first component and the load arm region of the second component are adapted to contact the substrate.

14. The electronic assembly of claim 10, wherein the device comprises a semiconductor die, and wherein the load arm region of the first component and the load arm region of the second component are adapted to contact the semiconductor die.

15. The electronic of claim 10, wherein the second component first and second lever arms, the axle region therebetween, and the load arm region extending from the axle region are integrally formed.

16. The electronic assembly of claim 10, wherein the first and second lever arms of the first component are longer than the first and second lever arms of the second component.

17. An electronic assembly comprising:

a circuit board;

a socket coupled to the circuit board;

a device positioned in the socket; and a load mechanism including first and second components;

the first component pivotally coupled to the circuit board, the first component including first and second lever arms and an axle region therebetween, the first component also including a load arm region extending from the axle region and adapted to transmit a load when a force is applied to the first component lever arms, the first component further including a handle region positioned between the first component lever arms;

the second component pivotally coupled to the circuit board, the second component including first and second lever arms and an axle region therebetween, the second component also including a load arm region extending from the axle region and adapted to transmit a load when a force is applied to the second component lever arms;

wherein the first and second components are positioned so that when a force is applied to the first component lever arms, the first lever arm of the first component engages the first lever arm of the second component and applies a force thereto, and the second lever arm of the first component engages the second lever arm of the second component and applies a force thereto; and a latch positioned to engage the handle region when a suitable force is applied to the handle region;

wherein the load mechanism is positioned so that a sufficient application of force applied to the load mechanism will cause the load arm region of the first component and the load arm region of the second component to contact the device.

18. The electronic assembly of claim 17, wherein the load arm regions of the first and second components are substantially triangular shaped.

19. The electronic assembly of claim 17, wherein the device comprises a package, the package including at least one die and a substrate to which the die is coupled, and wherein the load arm region of the first component and the load arm region of the second component are adapted to contact the substrate.

20. The electronic assembly of claim 17, wherein the device comprises a semiconductor die, and wherein the load arm region of the first component and the load arm region of the second component are adapted to contact the semiconductor die.

* * * * *

UNITED STATES PATENT AND TRADEMARK OFFICE
CERTIFICATE OF CORRECTION

| | | |
|---|---|---|
| PATENT NO. | : 8,081,489 B2 | Page 1 of 1 |
| APPLICATION NO. | : 12/344193 | |
| DATED | : December 20, 2011 | |
| INVENTOR(S) | : D. J. Llapitan et al. | |

It is certified that error appears in the above-identified patent and that said Letters Patent is hereby corrected as shown below:

In the Claims

Column 6, Line 18, claim 2: "claim 1 wherein" should read --claim 1, wherein--.

Column 6, Line 22, claim 3: "claim 1 wherein" should read --claim 1, wherein--.

Signed and Sealed this
Seventh Day of October, 2014

Michelle K. Lee
*Deputy Director of the United States Patent and Trademark Office*